United States Patent
Derat

(10) Patent No.: US 11,175,324 B2
(45) Date of Patent: Nov. 16, 2021

(54) SYSTEM AND METHOD OF CHARACTERIZING A QUIET ZONE OF AN OVER-THE-AIR TESTING SPACE

(71) Applicant: Rohde & Schwarz GmbH & Co. KG, Munich (DE)

(72) Inventor: Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/875,009

(22) Filed: May 15, 2020

(65) Prior Publication Data
US 2020/0386800 A1 Dec. 10, 2020

(30) Foreign Application Priority Data

Jun. 7, 2019 (EP) ..................................... 19179042

(51) Int. Cl.
*G01R 29/08* (2006.01)

(52) U.S. Cl.
CPC ..... *G01R 29/0821* (2013.01); *G01R 29/0871* (2013.01)

(58) Field of Classification Search
CPC ............ G01R 29/0821; G01R 29/0871; G01R 35/005; G01R 29/0892; G01R 29/08
See application file for complete search history.

(56) References Cited

U.S. PATENT DOCUMENTS

| | | | |
|---|---|---|---|
| 9,843,103 B2* | 12/2017 | Bowers | G01S 13/887 |
| 2003/0193441 A1* | 10/2003 | Zimmerman | H01Q 1/521 |
| | | | 343/725 |
| 2016/0116422 A1* | 4/2016 | Portune | G01N 22/00 |
| | | | 324/638 |
| 2018/0196974 A1* | 7/2018 | Hunziker | G06K 7/10316 |

FOREIGN PATENT DOCUMENTS

| | | |
|---|---|---|
| CN | 103051399 B | 11/2014 |
| DE | 102017122443 A1 | 3/2019 |
| EP | 2111700 A1 | 10/2009 |
| EP | 2730040 A1 | 5/2014 |
| WO | 2008/099067 A1 | 8/2008 |

(Continued)

OTHER PUBLICATIONS

Thorpe, J.R. et al., "Characterizing the quiet zone of an anechoic chamber," Technical Seminar on Antenna Measurements and SAR (AMS 2004), Jun. 2004, 4 pages.

(Continued)

*Primary Examiner* — Alvaro E Fortich
*Assistant Examiner* — Zannatul Ferdous
(74) *Attorney, Agent, or Firm* — Christensen O'Connor Johnson Kindness PLLC

(57) ABSTRACT

A system for characterizing a quiet zone of an over-the-air testing space includes at least one measurement antenna and at least one scattering member. The measurement antenna is configured to at least transmit electromagnetic signals. The scattering member includes predefined scattering properties. The scattering member is enabled to scatter the electromag- (Continued)

netic signals so as to generate scattered electromagnetic signals that are transmitted in a defined manner. Further, a method of characterizing a quiet zone of an over-the-air testing space is described.

21 Claims, 2 Drawing Sheets

(56) References Cited

FOREIGN PATENT DOCUMENTS

| | | |
|---|---|---|
| WO | 2013/004887 A1 | 1/2013 |
| WO | WO-2013004887 A1 * | 1/2013 ......... H04B 17/3912 |

OTHER PUBLICATIONS

Viikari, V., et al., "A Feed Scanning Based APC Technique for Compact Antenna Test Ranges," IEEE Transactions on Antennas and Propagation 53(10):3160-3165, Oct. 2005.

Ericsson "CR to TR 37,843: Addition of RC MU evaluation and description in clause 2 and subclause 10.5," 3rd Generation Partnership Project (3GPP), Feb. 2019, 18 pages.

3GPP Technical Report "Technical Specification Group Radio Access Network; Measurements of radio performances for UMTS terminals in speech mode (Release 11)," 3rd Generation Partnership Project (3GPP), Mar. 2014, 101 pages.

Dirix, M., et al., "Full-Sphere Angle of Arrival Detection Using CMRCLEAN," IEEE Transactions on Antennas and Propagation 65(5):2769-2772, May 2017.

* cited by examiner

SYSTEM AND METHOD OF CHARACTERIZING A QUIET ZONE OF AN OVER-THE-AIR TESTING SPACE

TECHNICAL BACKGROUND

Embodiments of the present disclosure relates to a system for characterizing a quiet zone of an over-the-air testing space, particularly the quality of the quiet zone. Further, embodiments of the present disclosure relate to a method of characterizing a quiet zone of an over-the-air testing space, particularly the quality of the quiet zone.

BACKGROUND

In the state of the art, systems are known that are used to evaluate the quality of a quiet zone of an over-the-air testing space, for instance an OTA chamber. However, the systems known require a lot of different measurements that have to be conducted in a subsequent manner Typically, these measurements are carried out by moving a reference antenna across a volume within the OTA chamber where the characterization of the quiet zone is required. The respective antenna is normally connected via a radio frequency cable, RF cable, to a signal generator or rather a signal analyzer in order to forward the signals, namely the radio frequency signals, from the signal generator to the antenna or rather the antenna to the signal analyzer.

However, it has turned out that the presence of the cable and the movements of the cable associated with the movement of the antenna during the measurements create electromagnetic field perturbations and uncertainties, which in turn have an impact on the evaluation of the quality of the quiet zone.

To overcome this problem, it is known in the state of the art to transform the radio frequency signal into light yielding a so-called radio frequency over fiber (RF-over-fiber) concept. However, the transformation of the radio frequency signals into light, namely optical signals, usually introduces limitations with respect to the dynamic range and the frequency range such that the evaluation of the quality of the quiet zone only covers a certain range with respect to the dynamics and frequency. In other words, the evaluation of the quiet zone, particularly its quality, is limited.

Accordingly, there is a need for a system and a method ensuring evaluation of the quality of the quiet zone of an over-the-air testing space in a reliable and cost-efficient manner.

SUMMARY

To address this need or others, a system for characterizing a quiet zone of an over-the-air testing space is provided, for example the quality of the quiet zone. In an embodiment, the system has at least one measurement antenna and at least one scattering member. The measurement antenna is configured to at least transmit electromagnetic signals. The scattering member comprises predefined scattering properties. The scattering member is also enabled to scatter the electromagnetic signals so as to generate scattered electromagnetic signals that are transmitted in a defined manner.

Accordingly, the system comprises at least one scattering member that relates to a reference scattering object, as it has predefined scattering properties. The scattering member is located in the quiet zone under test within the over-the-air testing space, for instance an OTA chamber. Thus, the scattering member generates a scattered field having predefined characteristics due to the predefined scattering properties of the scattering member. In other words, the respective scattering member has well-known scattering properties. Thus, knowledge of the electromagnetic signals generated together with the scattered electromagnetic signals and the well-known and predefined scattering properties ensure that the quality of the quiet zone of the over-the-air testing space can be evaluated in a reliable manner.

The well-known scattering properties of the scattering member result in a scattered field having well-known characteristics such that deviations from the field expected are caused by the quiet zone, for example by imperfections of the quiet zone that influence the quality. Hence, the quality of the quiet zone can be determined due to the knowledge of the above-mentioned parameters/characteristics. The imperfections of the field in the quiet zone may be measured in terms of phase errors, ripple-amplitude deviations, and taper-amplitude deviations.

The scattered field can be described by a closed-form expression that can be evaluated in a finite number of operations. In some embodiments, the influence of radio frequency cables connected to an antenna placed within the quiet zone under test is removed, as no such antenna is required to be located within the quiet zone under test, namely for measuring purposes of the scattered electromagnetic signals.

The respective antenna used for measuring the scattered electromagnetic signals may be located outside of the quiet zone. This antenna may also be called receiving antenna since this antenna receives the scattered electromagnetic signals.

Further, limitations with regard to the dynamic range and/or frequency coverage do not occur, which would take place when using the radio frequency over fiber concept according to which the radio frequency signals are converted or rather transformed into light for testing purposes.

The respective scattering member may be small enough to provide a good resolution of the quiet zone evaluation, but large enough to ensure that sufficient power of the electromagnetic signals is scattered back for evaluation purposes.

Thus, the scattering member may have a size that relates to a fraction of the wavelength used for testing purposes up to a few wavelengths at higher frequencies.

In general, the predefined and well-known scattering properties of the scattering member correspond to a well-known scattering function provided by the scattering member.

In some embodiments, the (scattered) electromagnetic signals correspond to radio frequency signals (RF signals).

An aspect provides that the scattered electromagnetic signals are scattered in a defined direction. As mentioned above, the scattering direction may inter alia depend on the shape and size of the scattering member. Furthermore, the scattering direction, namely the defined one, depends on the impinging angle of the electromagnetic signals transmitted into the quiet zone under test.

Another aspect provides that the at least one measurement antenna is configured to also receive the scattered electromagnetic signals. Accordingly, the same measurement antenna is used for transmitting the electromagnetic signals towards the quiet zone under test as well as to receive the scattered electromagnetic signals. In other words, the same measurement antenna is switched from a transmitting mode into a receiving mode. The single measurement antenna may be movable or rather controlled to be moved to a certain receiving position where it is expected to receive the scattered electromagnetic signals.

Alternatively, the at least one measurement antenna is a transmitting antenna, wherein the system comprises a receiving antenna separately formed with respect to the transmitting antenna. The receiving antenna is configured to receive the scattered electromagnetic signals. Thus, the system comprises at least two different antennas that are assigned to the transmitting operation as well as the receiving operation. Both measurement antennas, namely the transmitting antenna as well as the receiving antenna, are formed separately with respect to each other such that they can be located at different locations with respect to the quiet zone under test. This ensures that the scattered electromagnetic signals, which may be scattered in a direction pointing away from the transmitting antenna, can be received by the receiving antenna. In some embodiments, the transmitting antenna as well as the receiving antenna may be stationary during the measurement.

Generally, a single antenna, namely the measurement antenna, may be provided that is controlled such that it represents the transmitting antenna and the receiving antenna, namely the respective functionalities.

Furthermore, the system may comprise a reflector assigned to the measurement antenna. Thus, the system may have a so-called compact antenna test range (CATR) wherein the reflector is assigned to the measurement antenna, for example the transmitting antenna. The electromagnetic signals generated by the transmitting antenna are directed towards the reflector in order to be reflected into the quiet zone under test.

The reflector may be shaped such that the electromagnetic signals correspond to plane waves when reaching the quiet zone under test.

Alternatively, the electromagnetic signals may reach the quiet zone as plane waves due to the entire travelling distance of the electromagnetic signals, for example due to the additional signal path provided by the reflector.

For instance, the reflector and the measurement antenna, for example the transmitting antenna, are located on a common bar via which the distance between the measurement antenna and the reflector can be set individually. The bar ensures that the relative orientation of the reflector with respect to the measurement antenna can be maintained in the desired manner.

Generally, a compact antenna test range (CATR) produces a nearly uniform plane wave in a very short distance via a system of reflectors (or a single paraboloidal reflector)

Another aspect provides that the at least one scattering member and/or the at least one measurement antenna are/is movable, for example during the over-the-air measurement. Thus, the scattering member and/or the measurement antenna may be moved during the measurements. Hence, different locations within the quiet zone under test can be analyzed by moving the scattering member in order to gather information of the entire quiet zone under test.

For instance, the at least one measurement antenna is moved during the measurements, provided that the same measurement antenna is used as the transmitting antenna and the receiving antenna. In other words, the at least one measurement antenna is moved to a location at which the scattered electromagnetic signals may be scattered. The respective location may be known previously due to the fact that the scattering member has predefined and well-known scattering properties such that the scattered electromagnetic signals are transmitted in a defined manner, namely in a defined direction. Accordingly, the measurement antenna is moved to the respective location in order to ensure that the scattered electromagnetic signals are received by the measurement antenna for analyzing purposes. The measurement antenna can be moved so that the measurement antenna is positioned at a location at which the scattered power is sufficiently high.

Another aspect provides that the scattering member is polarized. Thus, the scattering member has an influence on the polarization of the electromagnetic signals, for example the scattered ones, when the electromagnetic signals are scattered by the scattering member. For instance, the scattering member is configured to change the polarization or at least adapt the polarization of the electromagnetic signals.

Further, the scattering member may be assigned to a scattering array comprising several scattering members in a defined manner. The scattering members establishing the scattering array may be arranged in a matrix or any other regular grid. The arrangement of the several scattering members may also have an influence on the overall scattering properties. Put another way, the electromagnetic signals are scattered by the individual scattering members of the scattering array in a defined manner, but differently. The scattering direction inter alia depends on the specific arrangement of the scattering members within the scattering array.

Another aspect provides that the at least one scattering member has a predefined shape and/or predefined surface properties. The shape as well as the surface properties of the at least one scattering member have/has an influence on the scattering properties of the scattering members such that the scattered electromagnetic signals are influenced by the respective parameters/characteristics of the scattering member, namely its shape and/or its surface properties.

The scattering member may relate to a metallic sphere or a sphere provided with a dielectric material on its outer surface, for example coated with the dielectric material. However, the scattering member can also be a cylinder, a disk or of any other shape intended for scattering the electromagnetic signals transmitted towards the quiet zone under test.

Depending on the shape of the scattering member, the scattered electromagnetic signals may be scattered in a certain direction, namely a defined direction, resulting in a scattered field that is expected due to the well-known scattering properties of the scattering member. Put another way, the scattered electromagnetic signals are scattered in a certain range or rather field depending on the shape of the scattering member.

According to another aspect, the electromagnetic signals relate to broadband signals. In some embodiments, the electromagnetic signals relate to radio signals that are transmitted over-the-air. The bandwidth of the electromagnetic signals is broad such that the electromagnetic signals are broadband signals. In general, the electromagnetic signals are non-optical signals, namely invisible for the human eye.

The system may comprise an analyzing circuit or module that is connected with the at least one measurement antenna acting as the receiving antenna. Thus, the scattered electromagnetic signal received is forwarded to the analyzing module for analyzing purposes.

In addition, the system may comprise a control circuit or module. The control module may be configured to control the at least one measurement antenna and/or the scattering member, for example its movement during the over-the-air measurement.

In general, the scattering member may be a passive scattering member that only reflects/scatters the impinging electromagnetic signals. Put differently, the passive scattering member does not actively adapt the electromagnetic properties of the electromagnetic signals when scattering the electromagnetic signals by an electrical circuit component.

Further, a method of characterizing a quiet zone of an over-the-air testing space is provided, for example its quality. In an embodiment, the method comprises the following steps:

Transmitting an electromagnetic signal towards the quiet zone, in which at least one scattering member is located, which has predefined scattering properties, Scattering the electromagnetic signal by the scattering member in order to generate a scattered electromagnetic signal, Receiving the scattered electromagnetic signal, and Analyzing the scattered electromagnetic signal received in order to characterize the quiet zone of the over-the-air testing space, for example the quality of the quiet zone.

In some embodiments, the electromagnetic signals are generated outwards of the quiet zone under test and transmitted towards the quiet zone where the electromagnetic signal generated impinges on the at least one scattering member in order to be scattered. As the scattering member has predefined scattering properties, it is ensured that scattered electromagnetic signals are provided which are scattered in a defined manner due to the predefined and well-known scattering properties of the scattering member.

The scattered electromagnetic signal is received by a receiving antenna, for instance a measurement antenna operated in a receiving mode.

The scattered electromagnetic signal received is analyzed by an analyzing circuit or module in order to characterize the quiet zone of the over-the-air testing space. In other words, the quiet zone is characterized by evaluating local deviations, as the impinging wave parameters can be retrieved due to the fact that the transmitted electromagnetic signal as well as the scattering properties of the at least one scattering member are predefined or rather known.

For instance, deviations from an electromagnetic field assigned to a plane wave are obtained during the analysis.

An aspect provides that the scattered electromagnetic signal is transmitted in a defined direction. As mentioned above, the scattering member has predefined scattering properties yielding a defined scattering of the electromagnetic signal. Thus, it is ensured that the scattered electromagnetic signal is transmitted in a defined manner.

Another aspect provides that the scattered electromagnetic signal is received by an antenna that also transmits the electromagnetic signal towards the quiet zone. Thus, the same measurement antenna can be used for transmitting and receiving purposes. In other words, the (single) measurement antenna has a transmitting operation mode as well as a receiving operation mode.

Alternatively, the scattered electromagnetic signal is received by a receiving antenna that is separately formed with respect to a transmitting antenna that transmits the electromagnetic signal towards the quiet zone. Thus, the system comprises two different antennas wherein one of the antennas is used for transmitting purposes whereas the other one is used for receiving purposes. Thus, the system comprises a transmitting antenna as well as a receiving antenna.

Furthermore, the electromagnetic signal transmitted towards the quiet zone may be reflected by a reflector prior to impinging on the scattering member. Thus, the electromagnetic signal is generated by the transmission antenna and forwarded to the reflector that reflects the electromagnetic signal transmitted towards the quiet zone under test. In other words, the reflector is assigned to the measurement antenna acting as the transmission antenna.

Additionally or alternatively, the scattered electromagnetic signal is reflected by a reflector prior to being received. Thus, the scattered electromagnetic signal originating from the scattering member is reflected prior to being received by the measurement antenna acting as the receiving antenna.

Further, the at least one scattering member and/or a measurement antenna are/is moved during the over-the-air measurement. The measurement antenna may be the transmission antenna and/or the receiving antenna. Thus, the scattered field can be analyzed at different locations in order to analyze the uniformity of the scattered field inside the quiet zone. The movement of the scattering member ensures that the electromagnetic signals are scattered differently within the quiet zone wherein the respective influence can be evaluated. Further, the different locations can be analyzed, as the measurement antenna is moved during the over-the-air measurement in order to arrive at the different locations.

In some embodiments, the system described above may be configured to perform any one of the embodiments of the method described above.

Generally, the at least one measurement antenna is not moved within the quiet zone during the measurement. In some embodiments, the measurement antenna may be moved around the quiet zone.

In other words, the quiet zone may be free of any measurement antenna.

In some embodiments, the system is configured to generate a plane wave within the quiet zone such that a plane wave impinges on the at least one scattering member.

As the scattering member has predefined or rather well-known scattering properties, the resulting scattered electromagnetic signals can be calculated.

Even though the electromagnetic signals generated do not impinge on the scattering member as a plane wave, a plane wave is assumed for determining the expected field of scattered electromagnetic signals.

According to another aspect, the scattering member is active. Hence, the scattering member actively adapts the electromagnetic properties of the electromagnetic signals. Accordingly, an active scattering member is provided.

In some embodiments, the scattering member has a time-varying impedance. The time-varying impedance may be ensured by a direct current signal or a low frequency signal, wherein the respective signal, namely the direct current signal or the low frequency signal, has no influence on the radio frequency signal (RF signal) that is associated with the electromagnetic signals transmitted by the measurement antenna. In other words, the direct current signal or the low frequency signal is RF-invisible.

For instance, the at least one scattering member has an impedance varying module, for example an electrical circuit or an electrical circuit component, that varies the impedance appropriately. In other words, the impedance varying module effects the time-varying impedance of the scattering member.

The at least one scattering member may comprise an antenna, a (small) dipole and/or a (small) loop.

The antenna, the (small) dipole and/or the (small) loop may be connected with the impedance varying module, thereby establishing the active scattering member.

Additionally or alternatively, the at least one scattering member may be made of metal, thereby providing a metal structure.

Furthermore, the scattering member may be configured to modulate the electromagnetic signals when scattering the electromagnetic signals. Hence, a modulated scattering technique is provided which allows simultaneous measurements of the quiet zone uniformity, namely its quality, at multiple locations. The (active) scattering member actively adapts the electromagnetic properties of the electromagnetic signals when scattering them such that the electromagnetic signals are modulated by the respective scattering member.

For instance, several scattering members may be provided that modulate the electromagnetic signals in an individual manner, ensuring that the scattered electromagnetic signals scattered by a respective scattering member can be distinguished from each other in an unambiguous manner.

In general, each (active) scattering member allows to modulate, typically at a low frequency, the impinging electromagnetic signal, thereby generating a modulated scattered field.

For instance, respective modulation and/or frequency schemes at each individual scattering member can be adequately chosen such that distinguishing scattered electromagnetic signals are obtained. This allows to separate the contribution of the individual scattering members to the entire scattered field at each location by using standard demodulation techniques. The quality of the quiet zone can be evaluated in an easier and more efficient way.

In some embodiments, the evaluation can be performed in a fast manner since the measurement of the quiet zone uniformity, namely the quality of the quiet zone, can be performed at multiple locations simultaneously without suffering from overly reduced accuracy due to coupling between the various scattering contributions of the individual scattering members.

Another aspect provides that several scattering members are provided which are configured to generate scattered electromagnetic signals that are orthogonal. The respective scattering members are set such that they generate scattered electromagnetic signals that are orthogonal with respect to each other, simplifying the demodulation of the individual contributions. In other words, the distinguishing scattered electromagnetic signals may relate to orthogonal signals.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
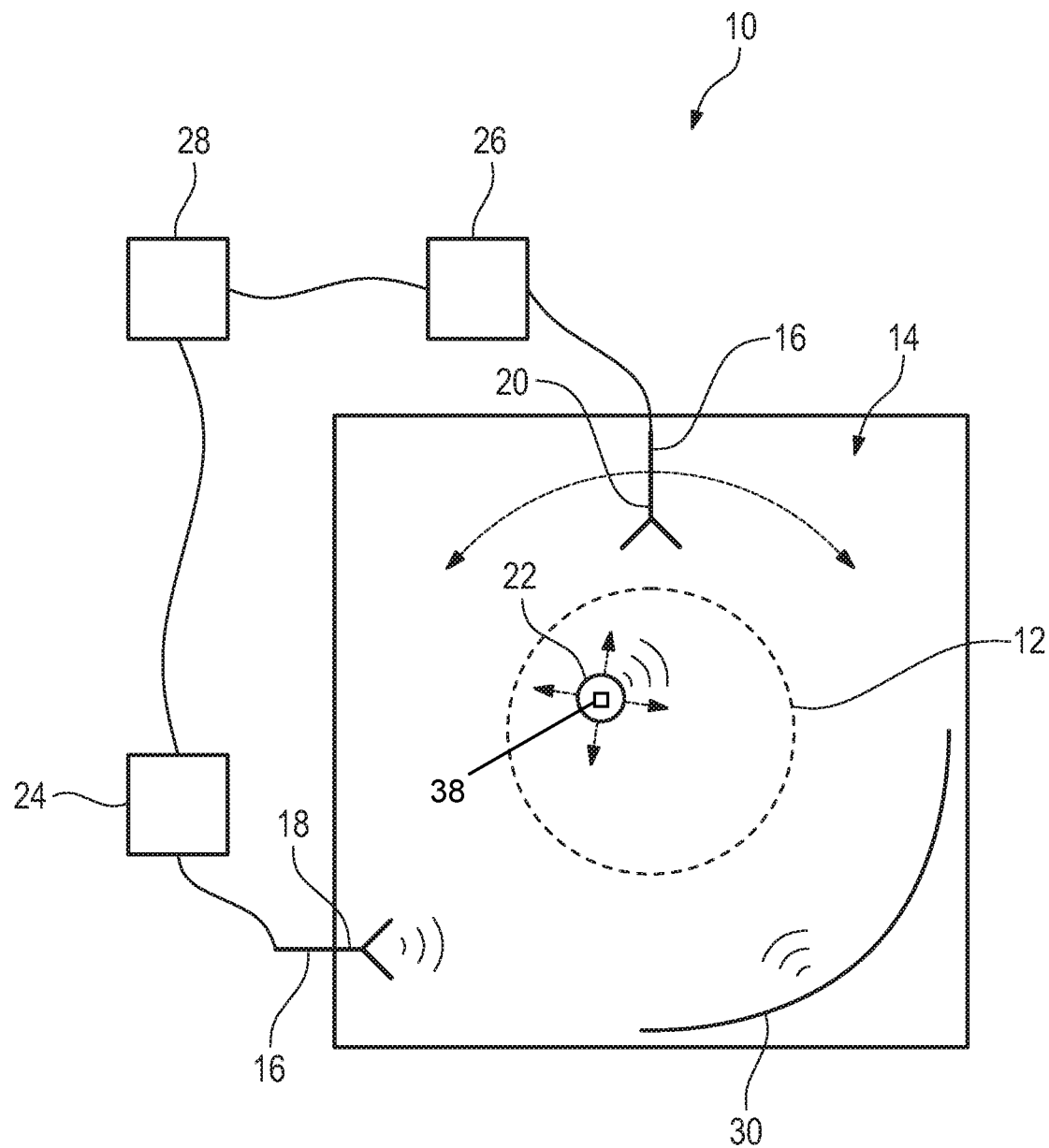
FIG. 1 shows a schematic overview of a representative system according to the present disclosure.

In FIG. 1, a system 10 is shown that is used to characterize a quiet zone 12 of an over-the-air testing space 14. In the shown embodiment, the system 10 comprises the over-the-air testing space 14 which encompasses the quiet zone 12 under test.

The system 10 has at least one measurement antenna 16. In the shown embodiment, the system 10 comprises two measurement antennas 16, namely a transmitting antenna 18 as well as a receiving antenna 20. Alternatively, one single measurement antenna 16 is used that can be operated in a transmitting mode and a receiving mode, as will be described later.

The measurement antennas 16 are assigned to the over-the-air testing space 14, for example the quiet zone 12. Thus, the measurement antennas 16 are configured to transmit electromagnetic signals, for instance radio (frequency) signals, towards the quiet zone 12 and to receive electromagnetic signals from the quiet zone 12, respectively.

The system 10 may also comprise at least one scattering member 22 that has predefined scattering properties. The scattering member 22 is located within the quiet zone 12 such that electromagnetic signals transmitted by the transmitting antenna 18 are directed towards the scattering member 22 to be scattered by the scattering member 22 in a defined manner. In other words, the scattering member 22 scatters the electromagnetic signals that may impinge on its surface so as to generate scattered electromagnetic signals that can be received by the receiving antenna 20.

In the shown embodiment, the scattering member 22 is passive. This means that the scattering member 22 does not actively adapt the electromagnetic properties of the electromagnetic signals when scattering the electromagnetic signals, thereby generating the scattered electromagnetic signals.

However, the scattering properties are well-known so that the scattered electromagnetic signals result in a field that can be at least predicted, for instance calculated.

The system 10 further comprises a signal generator 24 that is connected with the at least one measurement antenna 16, for example the transmitting antenna 18. The signal generator 24 generates a signal that is forwarded to the transmitting antenna 18 for being outputted and forwarded to the quiet zone 12 under test.

Further, the system 10 comprises an analyzing circuit or module 26 that is connected with the measurement antenna 16, namely the receiving antenna 20. Thus, the scattered electromagnetic signal(s) received by the receiving antenna 20 is/are forwarded to the analyzing module 26 for analyzing purposes.

In some embodiments, the system 10 may also comprise a control circuit or module 28 that is assigned to the signal generator 24 and/or the analysis module 26. The control module 28 may also be connected to the at least one measurement antenna 16 and/or the scattering member 22 as will be described later.

In some embodiments, the measurements performed for evaluating the quality of the quiet zone 12 may be controlled by the control module 28, for example in an automatic manner. This means that an operator of the system 10 initiates an evaluation, wherein the respective measurements are carried out automatically or rather without any further manual input. Thus, the control module 28 is configured to generate and to output control signals used to control the components of the system 10 in the desired manner.

Figure 2:
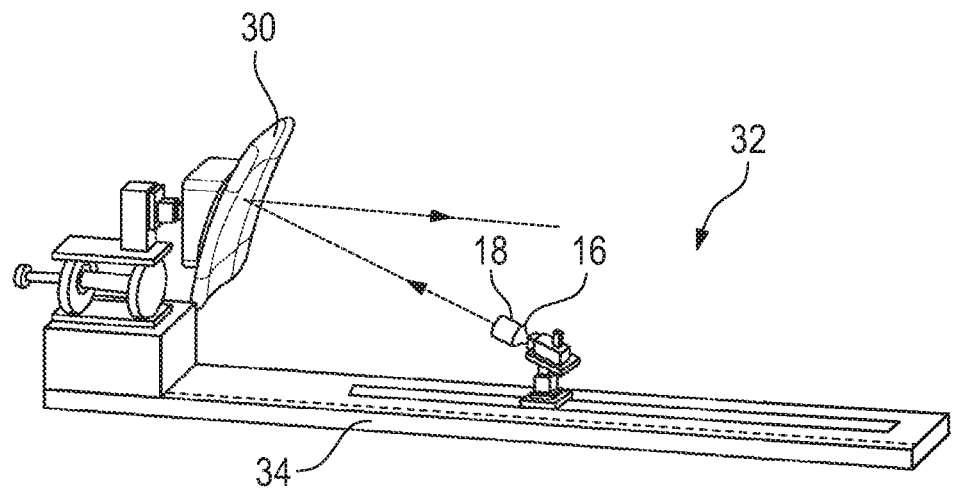
FIG. 2 shows a compact antenna test range used by the system shown in FIG. 1.

In addition, the system 10 may have a reflector 30 that is assigned to at least one of the measurement antennas 16. In the shown embodiment, the reflector 30 is assigned to the transmitting antenna 18 while establishing a compact antenna test range 32 (CATR). An example of a compact antenna test range 32 is shown in FIG. 2 in more detail.

The reflector 30 as well as the transmitting antenna 18 may be placed on a common bar 34 wherein the reflector 30 or rather the transmitting antenna 18 can be moved along the bar 34 relative to each other in order to adapt the distance between the reflector 30 and the transmitting antenna 18.

As already mentioned above, the control module 28 is assigned to the scattering member 22 and/or the at least one measurement antenna 16, for example the receiving antenna 20.

In some embodiments, the scattering member 22 as well as the receiving antenna 20 may be movable during the over-the-air evaluation measurement.

The over-the-air evaluation measurement may comprise a series of different over-the-air measurements carried out in a subsequent manner.

The control module 28 may control the movement of the scattering member 22 within the quiet zone 12 and/or the measurement antenna 16 in order to position the measurement antenna 16, for example the receiving antenna 20, at different locations with respect to the quiet zone 12, ensuring that the measurement antenna 16, namely the receiving antenna 20, receives the scattered electromagnetic signals. Various devices can be used to move the scattering member, including, for example, one or more angular and/or linear stages.

At the different locations reached, at least one over-the-air measurement may be performed. Thus, several over-the-air measurements done at the different locations, which together establish the over-the-air evaluation measurement.

Figure 3:
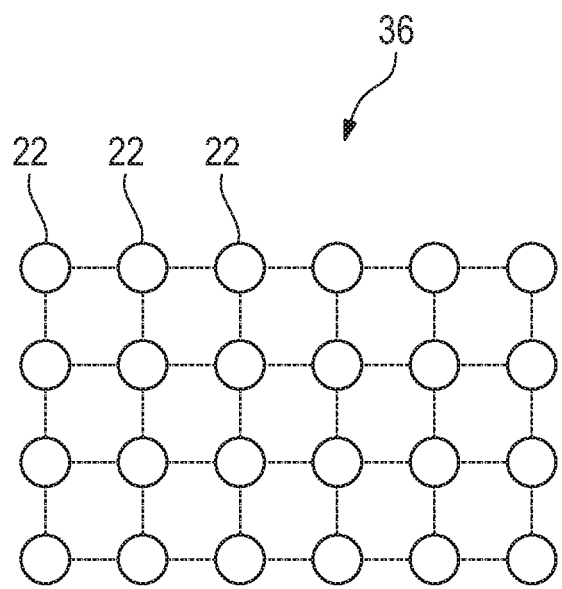
FIG. 3 shows a representative scattering array to be used by the system according to FIG. 1.

In FIG. 3, a specific embodiment of the scattering member 22 is shown. The scattering member 22 is part of a scattering array 36 that comprises several scattering members 22 in a defined manner. For instance, the scattering members 22 are arranged in a matrix or rather a regular grid so that the electromagnetic signals originating from the transmitting antenna 18 are scattered in a defined manner by the regularly arranged scattering members 22 of the scattering array 36.

The electromagnetic signals originating from the transmitting antenna 18 impinge on the respective surfaces of the scattering members 22 in order to be scattered in a defined manner.

For this purpose, the scattering members 22 may have a predefined shape and/or predefined surface properties ensuring certain pre-defined scattering properties.

In some embodiments, the scattering properties of the individual scattering members 22 each are predefined and well-known so that the impact of the individual scattering members 22 on a plane wave directed towards the quiet zone 12 can be calculated.

Thus, the quality of the quiet zone 12 can be evaluated by taking the well-known and predefined scattering properties of the scattering member 22 as well as the electromagnetic signals generated or rather transmitted into account.

The receiving antenna 20 receives scattered electromagnetic signals that are also taken into consideration for characterizing the quiet zone 12, for example its quality.

In some embodiments, the system 10 is used to characterize the quiet zone 12 of the over-the-air testing space 14 by introducing a reference scattering member, which is placed in the quiet zone 12 under test. The at least one scattering member 22 or rather the scattering array 36 is the only object placed within the quiet zone 12 during the measurements.

For characterizing purposes, an electromagnetic signal, for instance a radio (frequency) signal, for example a broadband signal, is generated by the signal generator 24 and transmitted towards the quiet zone 12 by the transmitting antenna 18.

If the reflector 30 is provided that is assigned to the transmitting antenna 18, the transmitted electromagnetic signal is reflected by the reflector 30 in order to be reflected towards the quiet zone 12. Hence, plane waves may be generated in a compact range, as the signal path is extended by the reflector 30, for example the additional signal path between the reflector 30 and the transmitting antenna 18.

At least a part of the electromagnetic signal generated reaches the scattering member 22 that is located in the quiet zone 12. As mentioned above, the scattering member 22 has predefined scattering properties such that the scattered electromagnetic signals are directed in a defined direction resulting in a field of scattered electromagnetic signal(s).

The power distribution of the scattered electromagnetic signal(s) can be predicted so that the receiving antenna 20 may be placed at a location at which scattered electromagnetic signals with relatively high powers are to be expected.

The receiving antenna 20 receives the scattered electromagnetic signal and forwards the scattered electromagnetic signal received to the analyzing module 26 for analyzing purposes.

For analyzing purposes, it is assumed that the scattering properties of the scattering member 22 are known. Thus, the impinging wave parameters can be retrieved in order to evaluate local deviations from a plane wave.

This information is used to characterize the quality of the quiet zone 12.

For improving the characterization, the scattering member 22 may be moved around within the quiet zone 12 so as to be located at different places within the quiet zone 12. Hence, more data can be retrieved that can be evaluated for characterizing purposes.

Furthermore, the scattering member 22 may be part of the scattering array 36 as shown in FIG. 3 such that a matrix or rather grid of scattering members 22 is provided. The scattering array 36 ensures that a field of the scattered electromagnetic signals is generated having different properties.

Even if only a single (stationary) scattering member 22 is used, different locations may be sensed by moving the at least one receiving antenna 22 during the over-the-air measurement. In other words, the at least one receiving antenna 22 may be moved during the over-the-air measurement to obtain information at the different locations.

By taking several different locations into account for receiving scattered electromagnetic signal(s), the uniformity of the scattered field within the quiet zone 12 can be analyzed.

Thus, it is possible to characterize the quiet zone 12, for example its quality, in a reliable and cost-efficient manner.

Furthermore, the at least one scattering member 22 may be active. This means that the scattering member 22 actively adapts the electromagnetic properties of the electromagnetic signals when scattering the electromagnetic signals impinging on the scattering member 22, thereby generating the scattered electromagnetic signals.

The scattered electromagnetic signals may correspond to modulated electromagnetic signals since the active scattering member 22 actively adapts the electromagnetic properties of the electromagnetic signals, thereby modulating the electromagnetic signals. The (active) scattering member 22 allows to modulate, typically at a low frequency, the impinging electromagnetic signal, thereby generating a modulated scattered field.

In case of several scattering members 22 located in the quiet zone 12, for instance by the scattering array 36, each of the (active) scattering members 22 individually adapts the electromagnetic properties of the electromagnetic signals when scattering the electromagnetic signals impinging on the respective scattering member 22.

Hence, each of the scattering members 22 adapts or rather modulates the electromagnetic signals differently, for example in a distinguishable manner Thus, a modulated scattering technique is applied which allows simultaneous measurements of the uniformity of the quiet zone 12, namely its quality, at multiple locations.

For instance, several measurement antennas 16 may be provided, for example several receiving antennas 20. Alternatively, the single receiving antenna 20 is moved during the measurement, thereby reaching different locations for performing a respective measurement at the different locations.

Since the scattered electromagnetic signals scattered by the respective scattering members 22 can be distinguished from each other in an unambiguous manner, for instance due to a respective modulation and/or frequency scheme applied on the respective scattering members 22, the contribution of the individual scattering members 22 to the entire scattered field can be separated or rather determined by using standard demodulation techniques.

Accordingly, the quality of the quiet zone 12 can be evaluated in an easier and more efficient way. In some embodiments, the evaluation can be performed in a fast manner since the measurement of the uniformity of the quiet zone 12, namely the quality of the quiet zone 12, can be performed at multiple locations simultaneously without suffering from a reduced accuracy due to a coupling between the various contributions of the scattering members 22.

In some embodiments, the several scattering members 22 generate scattered electromagnetic signals that are orthogonal with respect to each other. This simplifies the demodulation of the individual contributions of the scattering members 22 significantly.

The at least one active scattering member 22 has a time-varying impedance that may be ensured by a direct current signal or a low frequency signal applied which however does not have an impact on the radio frequency (RF) signals used for measuring purposes.

For instance, the at least one active scattering member 22 has an (integrated) impedance varying module 38, for instance an electrical circuit or an electrical circuit component, which effects the time-varying impedance of the scattering member 22.

Generally, the active scattering member 22 may also comprise an antenna, a (small) dipole and/or a (small) loop that may be used to actively adapt the electromagnetic properties of the electromagnetic signals by a time-varying impedance in order to modulate the electromagnetic signals in a defined manner.

Accordingly, the at least one active scattering member 22 may not only scatter the electromagnetic signals into a defined direction due to its predefined scattering properties, but also adapt the electromagnetic properties of the electromagnetic signals when scattering them in a defined manner.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A system for characterizing a quiet zone of an over-the-air testing space, comprising:
at least one measurement antenna and at least one scattering member, wherein the scattering member is located in the quiet zone under test within the over-the-air testing space, wherein the measurement antenna is configured to at least transmit electromagnetic signals, wherein the scattering member relates to a reference scattering object as the scattering member comprises predefined scattering properties, wherein the scattering member is enabled to scatter the electromagnetic signals so as to generate scattered electromagnetic signals that are transmitted in a defined manner, and wherein the system further comprises an analyzing circuit configured to analyze the scattered electromagnetic signals in order to characterize the quiet zone since the predefined scattering properties of the scattering member result in a scattered field having well-known characteristics such that deviations from the field expected are caused by the quiet zone.

2. The system according to claim 1, wherein the scattered electromagnetic signals are scattered in a defined direction.

3. The system according to claim 1, wherein the at least one measurement antenna is configured to also receive the scattered electromagnetic signals.

4. The system according to claim 1, wherein the at least one measurement antenna is a transmitting antenna, wherein the system comprises a receiving antenna separately formed with respect to the transmitting antenna, and wherein the receiving antenna is configured to receive the scattered electromagnetic signals.

5. The system according to claim 1, wherein the system comprises a reflector assigned to the measurement antenna.

6. The system according to claim 1, wherein the at least one scattering member and/or the at least one measurement antenna are/is movable.

7. The system according to claim 1, wherein the scattering member is polarized.

8. The system according to claim 1, wherein the scattering member is assigned to a scattering array comprising several scattering members in a defined manner.

9. The system according to claim 1, wherein the at least one scattering member has a predefined shape and/or predefined surface properties.

10. The system according to claim 1, wherein the electromagnetic signals relate to broadband signals.

11. The system according to claim 1, wherein the scattering member is active.

12. The system according to claim 1, wherein the scattering member has a time-varying impedance.

13. The system according to claim 1, wherein the scattering member is configured to modulate the electromagnetic signals when scattering the electromagnetic signals.

14. The system according to claim 1, wherein several scattering members are provided which are configured to generate scattered electromagnetic signals that are orthogonal.

15. A method of characterizing a quiet zone of an over-the-air testing space, comprising:
    transmitting an electromagnetic signal towards the quiet zone, in which at least one scattering member is located, which relates to a reference scattering object as the scattering member has predefined scattering properties;
    scattering the electromagnetic signal by the scattering member in order to generate a scattered electromagnetic signal;
    receiving the scattered electromagnetic signal; and
    analyzing the scattered electromagnetic signal received in order to characterize the quiet zone of the over-the-air testing space, wherein the predefined scattering properties of the scattering member result in a scattered field having well-known characteristics such that deviations from the field expected are caused by the quiet zone.

16. The method according to claim 15, wherein the scattered electromagnetic signal is transmitted in a defined direction.

17. The method according to claim 15, wherein the scattered electromagnetic signal is received by an antenna that also transmits the electromagnetic signal towards the quiet zone or wherein the scattered electromagnetic signal is received by a receiving antenna separately formed with respect to a transmitting antenna that transmits the electromagnetic signal towards the quiet zone.

18. The method according to claim 15, wherein the electromagnetic signal transmitted towards the quiet zone is reflected by a reflector prior to impinging on the scattering member and/or wherein the scattered electromagnetic signal is reflected by a reflector prior to being received.

19. The method according to claim 15, wherein the at least one scattering member and/or a measurement antenna are/is moved during the over-the-air measurement.

20. The method according to claim 15, wherein the at least one scattering member is electromagnetically active and/or has a time-varying impedance.

21. A system for characterizing a quiet zone of an over-the-air testing space, comprising:
    at least one measurement antenna and at least one scattering member, wherein the scattering member is located in the quiet zone under test within the over-the-air testing space, wherein the measurement antenna is configured to at least transmit electromagnetic signals, wherein the scattering member relates to a reference scattering object as the scattering member comprises predefined scattering properties, wherein the scattering member is enabled to scatter the electromagnetic signals so as to generate scattered electromagnetic signals that are transmitted in a defined manner, and wherein the scattering member generates a scattered field having predefined characteristics due to the predefined scattering properties such that the quality of the quiet zone is determined due to the knowledge of the parameters and characteristics associated with the scattering member.

* * * * *